(12) United States Patent
Bures et al.

(10) Patent No.: US 6,459,242 B1
(45) Date of Patent: Oct. 1, 2002

(54) METHODS AND SYSTEMS FOR INDICATING A CHARGE STATE OF A CHARGE STORAGE DEVICE

(75) Inventors: Jeffrey A Bures, Salem, OR (US); James F Bausch, Salem, OR (US)

(73) Assignee: Hewlett-Packard Company, Palo-Alto, CA (US)

( * ) Notice: Subject to any disclaimer, the term of this patent is extended or adjusted under 35 U.S.C. 154(b) by 0 days.

(21) Appl. No.: 09/947,817

(22) Filed: Sep. 6, 2001

(51) Int. Cl.⁷ .............................................. H02M 10/46
(52) U.S. Cl. ........................................................ 320/132
(58) Field of Search .................................. 320/132, 134, 320/136, DIG. 19, DIG. 21; 324/426, 430, 432, 433

(56) References Cited

U.S. PATENT DOCUMENTS

| | | | |
|---|---|---|---|
| 4,163,193 A | 7/1979 | Kamiya | |
| 5,629,605 A | 5/1997 | Lavan | |

OTHER PUBLICATIONS

"AT&T User's Manual, Part 2: 900 MHz Cordless Telephone HS–8201/HS–8211", Aug. 2000, 2 pages.

*Primary Examiner*—Edward H. Tso

(57) ABSTRACT

A method and system of indicating a charge storage level of an electronic device. In one embodiment, the method comprises receiving a signal regarding a status of a charge storage device; assigning a value to said status; and, indicating a representation of said value.

18 Claims, 6 Drawing Sheets

METHODS AND SYSTEMS FOR INDICATING A CHARGE STATE OF A CHARGE STORAGE DEVICE

BACKGROUND OF THE INVENTION

Portable electronic devices have become ubiquitous in modern society. From cell phones to notebook computers, these devices play a role in the daily lives of many citizens. Along with this portability comes a finite amount of power that can be stored in a device's power supply or battery. This is especially important as consumers demand ever smaller and lighter portable devices, while at the same time demanding a longer useful period per charge to a the device's power supply or battery. Users are interested in knowing the charge state of the battery so they can plan accordingly. Thus, battery indicators are used to provide rudimentary information, such as indicating that the battery is either charged or is low on charge.

Consumers demand that every last drop of efficiency be squeezed out of these electronic devices to maximize the usefulness and convenience of the electronic device. Thus, it can be desirable that a charge indicator provide useful, unambiguous information and yet minimize the amount of charge used in powering the indicator.

Accordingly, the invention arose out of a desire to provide a battery charge level indicator that provides useful information to the user while minimizing the amount of power used in providing that information.

SUMMARY OF THE INVENTION

A charge storage indication device is described. In one embodiment, the charge storage indication device comprises a monitoring device capable of monitoring a status of a charge storage device. The charge storage indication device can include a processor coupled to the monitoring device and configured to assign a value to the monitored status. The charge storage indication device can also include an indicator operably coupled to the processor and capable of indicating a representation of the value.

In another embodiment, the charge storage indication device comprises a processor configured to receive data regarding a status of a charge storage device and assign a value to the data. The charge storage indication device also includes an indicator operably coupled to the processor and capable of indicating a representation of the value.

A further embodiment includes a method of indicating a charge level of a charge storage device. The method comprises monitoring a charge status of a charge storage device and mapping the charge status of the charge storage device to a value that represents a percentage of remaining charge in the charge storage device. The method then displays an indication period corresponding to the value. The indication period can comprise an alternating sequence of active and inactive periods. The number of active periods in the indication period can represent the value.

BRIEF DESCRIPTION OF THE DRAWINGS

The same components are used throughout the drawings to reference like features and components.

DETAILED DESCRIPTION OF THE PREFERRED EMBODIMENT

Overview

The described embodiments can provide information to a user of an electronic device by monitoring a charge status of a charge storage device that powers the electronic device. A processor can convert the monitored charge status into a value associated with the charge status. The processor then causes an indicator to be activated and inactivated a series of times. The series can represent the value associated with the charge storage device's charge status. Following the series, the indicator is inactive for a duration of time that distinguishes one series from the next series.

Exemplary Embodiment

Figure 1:
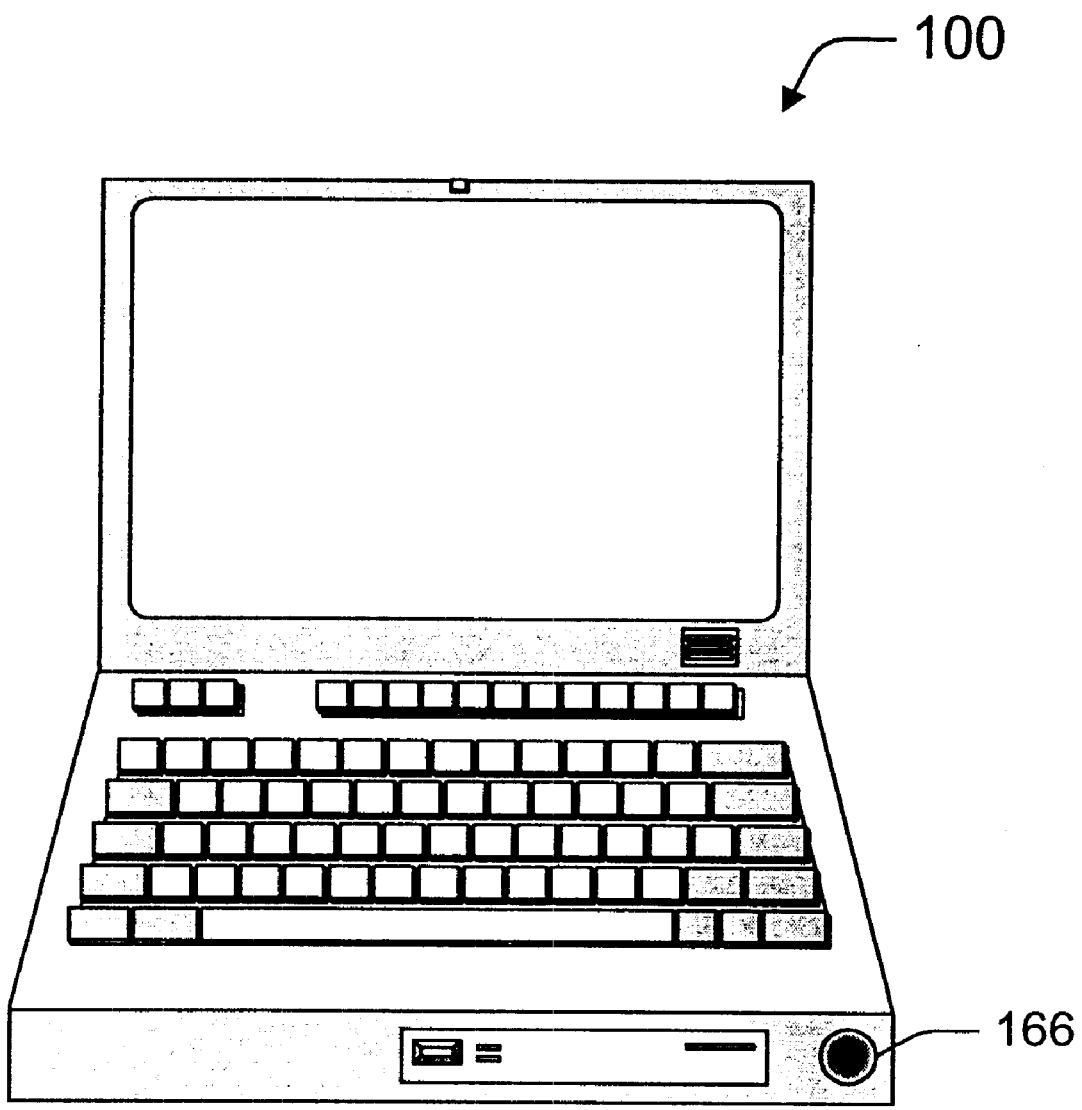
FIG. 1 is a front elevational view of an exemplary electronic device.

FIG. 1 shows an exemplary electronic device 100. In the embodiment of FIG. 1, the electronic device comprises a notebook computer. Other suitable electronic devices can include cell phones, personal digital assistants ("PDAs"), hand-held video games, and the like. FIG. 1 also shows an LED 166 that can display a value representing a battery charge state. The LED will be discussed in more detail below.

Figure 2:
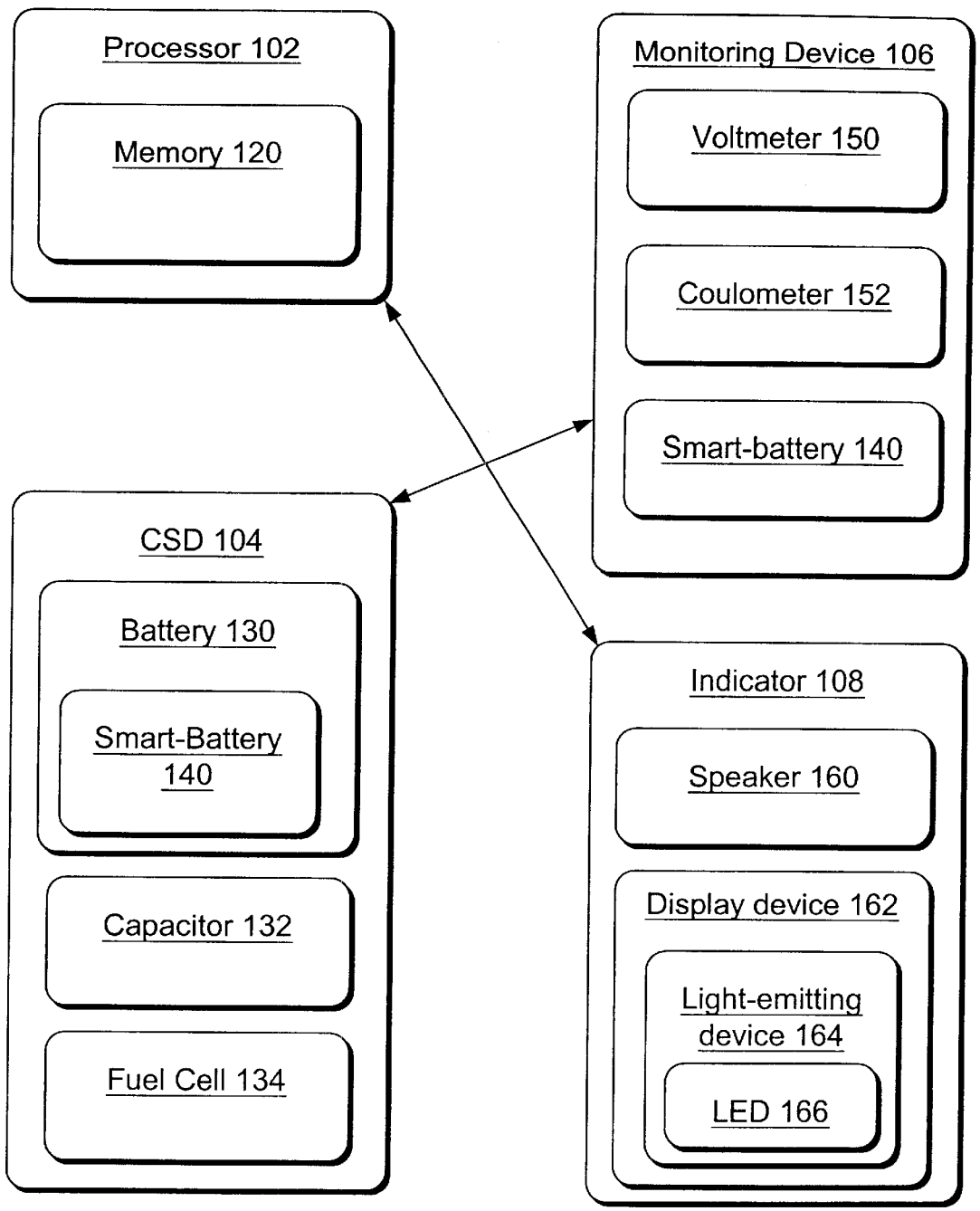
FIG. 2 is a block diagram that illustrates various components of an exemplary electronic device.

FIG. 2 is a block diagram of one possible embodiment of electronic device 100. FIG. 2 is for purposes of illustration, and many embodiments that accord with the invention need not include all of the described elements. As depicted in FIG. 2, the electronic device 100 can comprise a processor 102, a charge storage device (hereinafter "CSD") 104, a monitoring device 106, and an indicator 108. In some embodiments, the processor 102 can include memory 120. Suitable forms of memory include, but are not limited to, ROM, RAM, EPROM, and EEPROM.

The CSD 104 can comprise several different well-known technologies including batteries 130 and capacitors 132. In the FIG. 2, a portable fuel cell 134 can comprise a CSD in that it can provide a finite amount of energy before requiring its fuel stock to be replenished. The term battery can include various well-known battery technologies including but not limited to lead acid, lithium ion, nickel metal hydride, nickel cadmium, and so called intelligent or smart batteries 140.

The monitoring device 106 can comprise a voltmeter 150, a coulometer 152, or a smart battery 140 to name just a few. A voltmeter can serve as a monitoring device for a battery by providing a measured voltage that can be compared to a table of values of voltages corresponding to various degrees of discharge for the battery.

Alternatively, a coulometer 152 can measure the state of charge of a battery. The output of the coulometer can be processed to determine a state of charge or status of a battery. U.S. Pat. No. 4,499,424 discloses such a device.

Coulomb monitoring and other technologies have led to the development of still other monitoring devices that incorporate the features of a battery and a measuring or monitoring device into a single unit. So-called intelligent or smart batteries store energy and provide information about the charge status of the battery portion. The information about the charge status of the battery can then be processed to provide user-perceptible information regarding the charge status. Various smart battery technologies exist and are commercially available.

The electronic device can further comprise an indicator 108. The indicator can comprise any type of indicator capable of being configured to generate a human-perceptible signal. The indicator can be configured to have only two conditions or states. The two states can comprise an ON or active condition and an OFF or inactive condition. The indicator can comprise a single indicator. Using only a single indicator can decrease the energy consumed to indicate a CSD charge status value. Alternatively, the indicator can comprise multiple indicators that appear to a user as a single indicator. The use of a single indicator can provide increased efficiency. For example, some charge indicators use multiple LEDs in combination where the number of LEDs that are lighted represents a charge. Unfortunately, the use of multiple charge indicators can consume an unacceptably high amount of the very charge that they are displaying. In contrast, a single LED implemented in the present embodiments can provide useful unambiguous information to a user while minimizing energy usage.

Examples of suitable indicators include devices for emitting an audio signal such as a speaker (160), or a visual signal such as a display device 162. An example of a suitable display device can be a light-emitting device 164. An inexpensive and energy efficient light-emitting device for generating a visual signal can be an LED 166.

The indicator 108 can be located on the electronic device 100. The indicator can be provided specifically for the purpose of displaying CSD charge level values. Alternatively an existing display device or other indicator can be used. The latter configuration can decrease costs and minimize the drain on the battery while maximizing the information available to the user of the device. In an alternate embodiment, the indicator can be positioned on the CSD itself.

In one embodiment, a smart battery 140 can be used as a portable power source for an electronic device 100. The electronic device can be designed to allow an easy exchange of the smart battery as it becomes discharged. Alternatively, the electronic device can be configured to allow recharging of the smart battery while the smart battery is coupled with the electronic device. Smart-batteries can have the capability to self-monitor a charge status. This monitoring can provide data associated with a charge status that can be supplied to the processor 102. Commercial standards regarding smart battery technology are available to allow one skilled in the art to configure a processor and smart battery to allow data associated with a charge status to be received by the processor. A commercial consortium has established specifications for one smart battery technology. Specifications can be found under "Smart Battery Data Set Specifications" and other various titles. Specifications are also available with various commercially available smart battery products.

Many suitable processors 102 can provide satisfactory embodiments. A processor can be any processing device configurable to receive data regarding a CSD charge status and determine a CSD charge status value from a group of at least two values. The value can represent data useful to a user such as a percentage of the charge remaining in the CSD, or alternatively the value can represent an amount of operational time remaining in the CSD. The processor can then cause the display device 162, or other indicator 108, to be activated and inactivated in a manner that represents the CSD charge status value. Satisfactory processors exist in many of the electronic devices commonly in use today such as cell phones, notebook computers, personal digital assistants ("PDAs"), hand-held video games and the like. The processor 102 can be programmed with software to perform the functions of the described embodiments. This will be discussed in more detail below. Alternatively, firmware or hardwiring can be utilized alone, or in combination with each other and/or software. As an alternative to using an existing processor, a processor can be provided specifically for the functions described herein. Further, a smart battery 140 can contain a processor with enough processing capability to process the data independently of the electronic device 100 that the smart battery is used in.

The processor can be operably coupled to an LED 166. In some embodiments the LED can have two states, an ON or active state and an OFF or inactive state. The processor can be programmed to control the function of the LED to create a user-perceptible representation of the value. This can be accomplished by the processor controlling the active and inactive states of the LED. Alternatively, the LED can be configured to default to an OFF state so that the processor only has to control the duration of active states and the time lapse between the active states.

In the present embodiment, the use of a single LED can be inexpensive and have low energy usage. Further, having the LED serve a dual role can maximize the amount of information provided to a user. For example, a single LED can be utilized to indicate that the electronic device is in a standby mode and the charge state of the CSD. In this embodiment, the LED is only activated when the electronic device is in a standby mode. Therefore, a user, upon seeing the display, can know that the electronic device is in a standby mode and can discern the relative charge state of the battery. This dual use of a single LED minimizes drain on the CSD. Further energy savings can be achieved if the LED is located so that it can be perceivable by a user without the user activating the electronic device. Such a configuration is shown in FIG. 1 where the LED 166 can be seen whether the electronic device 100 is in an active or standby mode.

Figure 3:
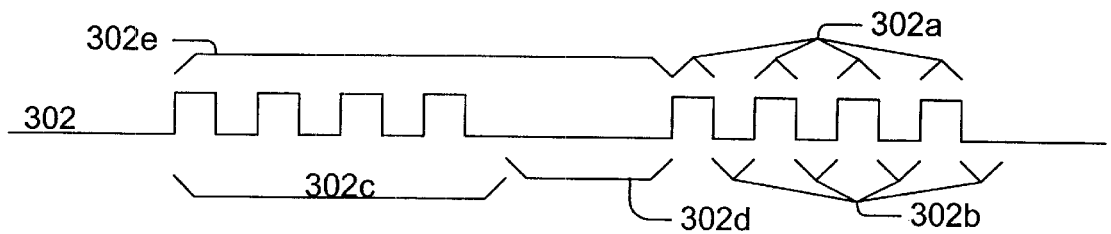
FIG. 3 shows an exemplary representation of output signals in accordance with one embodiment.
Figure 3:
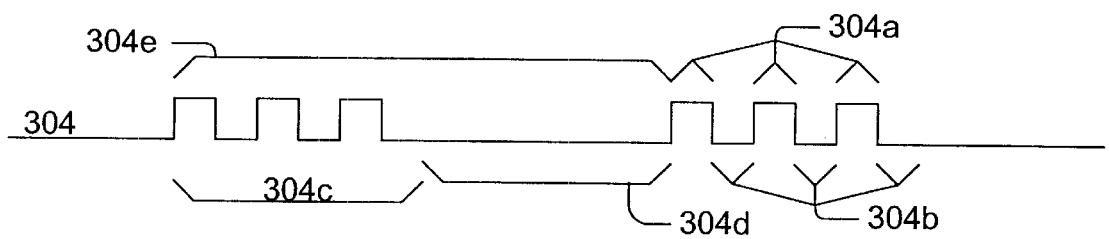
Figure 3:
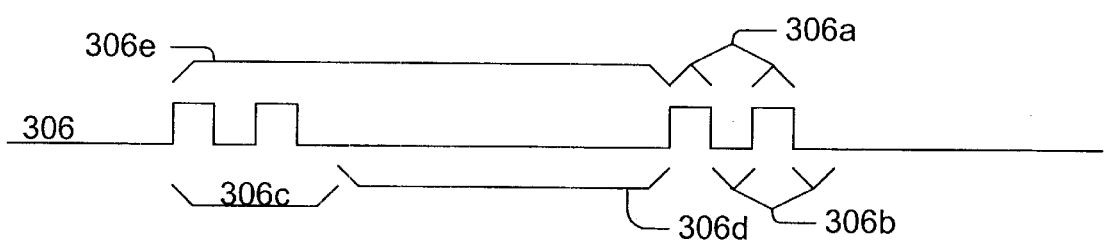
Figure 3:
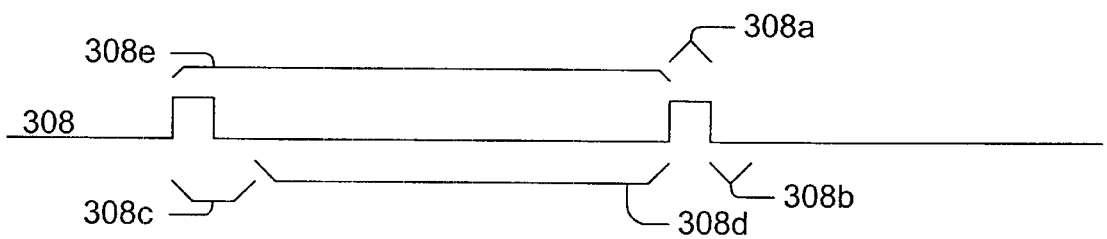
Figure 4:
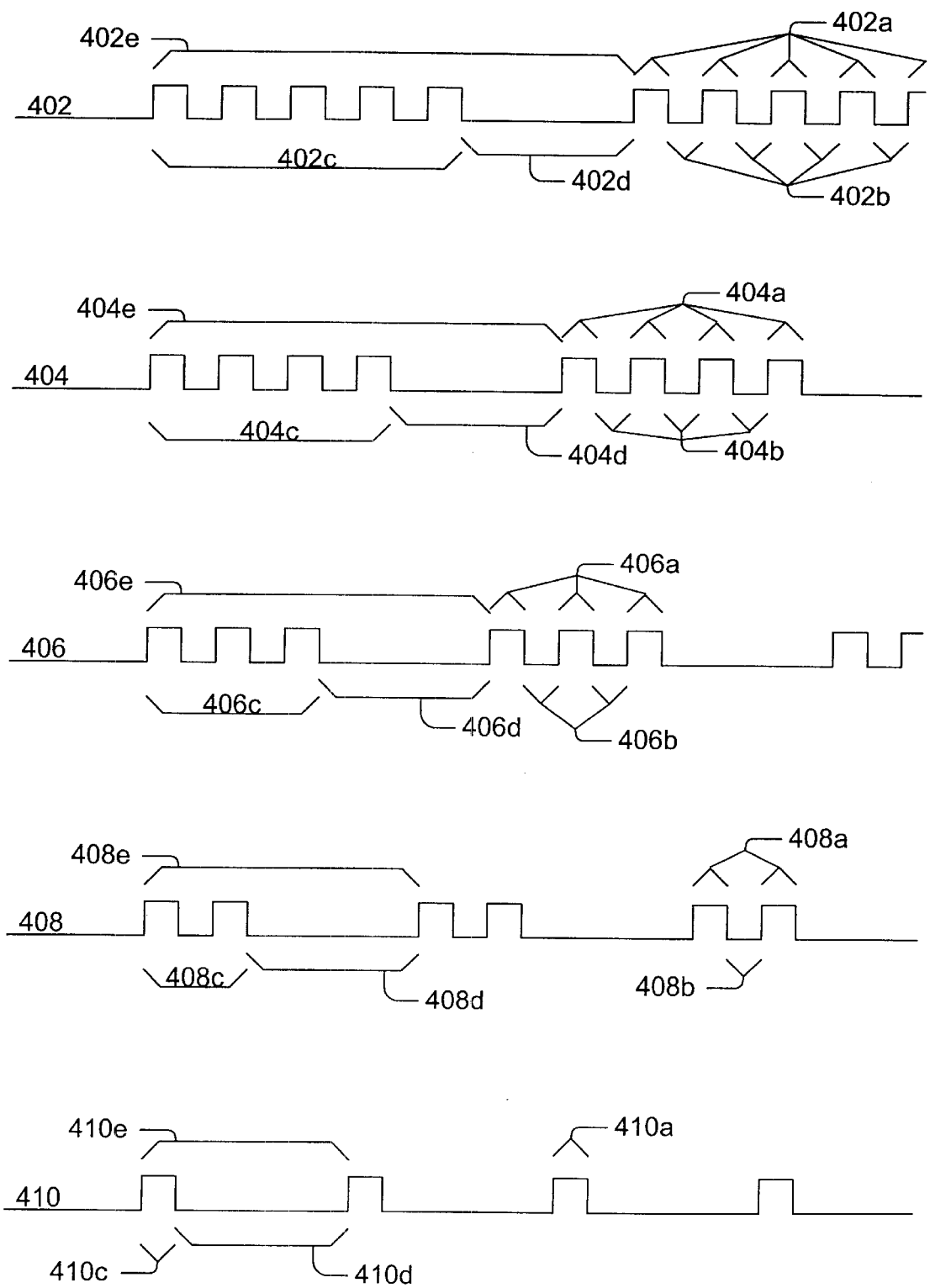
FIG. 4 shows an exemplary representation of output signals in accordance with one embodiment.

FIGS. 3 and 4 illustrate examples of how the value associated with the charge status can be indicated on an indicator 108. In these embodiments, indicator 108 comprises a single LED 166. FIGS. 3 and 4 are graphical representations of the output (302, 304, 306, 308, 402, 404, 406, 408, and 410) of an LED 166 having an ON or active condition (302*a*, 304*a*, 306*a*, 308*a*, 402*a*, 404*a*, 406*a*, 408*a*, and 410*a*) and an OFF or inactive condition (302*b*, 304*b*, 306*b*, 308*b*, 402*b*, 404*b*, 406*b*, and 408*b*). The processor 102 can cause the LED 166 to activate and inactivate a number of times representing a value associated with the battery or other CSD. This can constitute an indication period (302*c*, 304*c*, 306*c*, 308*c*, 402*c*, 404*c*, 406*c*, 408*c*, and 410*c*). The indication period can be followed by a rest period (302*d*, 304*d*, 306*d*, 308*d*, 402*d*, 404*d*, 406*d*, 408*d*, and 410*d*) that can allow a user to recognize the end of one indication period from the beginning of the next indication period. To achieve this distinction the rest period (302*d*–410*d*) can be longer in duration than any single inactive or ON condition (302*b*–408*b*) comprising an indication period (302*c*–410*c*). A sequential indication period and rest period can comprise an indication cycle (302*e*, 304*e*, 306*e*, 308*e*, 402*e*, 404*e*, 406*e*, 408*e*, and 410*e*).

FIG. 4 represents an embodiment where the rest period remains a constant duration. The indication period can decrease in duration to reflect a decreasing value. This causes the duration of the indication cycle to vary with the various values. In FIG. 4, the last inactive period of an indication cycle is incorporated into the rest period and so no rest period is shown on the output. This can be seen in regards to output 410, where there is only one active state 410a in an indication period 410c. Since the indication period is followed by a rest period 410d that incorporates the last inactive state of the indication period, no separate inactive period 410b is labeled. This can be contrasted with output 308 where the last inactive period is not included in the rest period. Regardless of the labels used in the illustrated embodiments, the rest period can be of any duration as long as it serves to distinguish the end of one indication period from the start of the next. To ensure user perception of the rest period between the last active state of one indication period and the first active state of the next indication period the rest period can be approximately two or more times the duration of any of the individual inactive conditions associated with an indication period. Some users may find four or more times the duration to be visually pleasing and easily identifiable.

FIG. 3 shows a graphical representation of an embodiment where the value representing the battery charge state can be chosen from a group of four values. Corresponding Table 1 shows these values.

TABLE 1

| Charge Status Data | Value | Output |
|---|---|---|
| 76–100% | 4 | 302 |
| 51–75% | 3 | 304 |
| 26–50% | 2 | 306 |
| 0–25% | 1 | 308 |

In this embodiment, if the processor receives data from the monitoring device which corresponds to a charge status of approximately 76–100 percent charge remaining, then the processor can assign the highest of the four values from the group and cause the LED to output the pattern represented by output 302. This output can include an indication period 302c comprising four active states 302a separated by four inactive states 302b. If the processor receives data indicating a charge remaining of approximately 51–75 percent, the processor can assign the second highest value from the group and cause output 304 to be generated. A charge remaining of approximately 26–50 percent can be assigned the third highest value by the processor and cause the output represented by output 306 to be generated. Data indicating a charge remaining of approximately 0 percent to approximately 25 can cause the lowest value to be assigned and output 308 to be generated.

The output of FIG. 3 shows the duration of each of the active and each of the inactive states as being equal. This combination can be visually pleasing to a user but varying durations can also be used. The output further shows the rest period 302d following the indication period. In this embodiment, the rest period can be about four times the duration of any individual inactive state comprising an indication period.

FIG. 3 shows an embodiment where the indication cycle 302e–308e can remain a constant duration. In this embodiment, the duration of the rest period 302d–308d can increase as the duration of the indication period 302c–308c decreases corresponding to a decreasing value. Thus, the indication period can decrease as the value indicating battery charge status decreases with decreasing battery charge. In order to maintain a constant indication cycle, the rest period duration can increase accordingly. This can be seen by comparing rest period 302d to rest period 304d, 306d, and 308d.

This embodiment can provide a quick unambiguous reference value of a charge state to a user, in contrast to many previous indication devices. Often these previous devices are ambiguous in the information they provide. For example, some display devices vary the brightness of the indicator depending upon the charge of the battery. Since ambient light conditions change, the user may not be able to discern the charge level indicated by the device. A dimmed display can appear bright at night or very dim in full sun.

Other displays adjust the frequency at which a display device is turned ON and OFF to indicate a relative charge state. This creates ambiguity for the user and requires the user to try to compare the frequency of the present display to past displays to determine a relative charge. This is especially cumbersome for users that do not utilize the device daily, as it can be difficult to remember what previous displays looked like for comparison.

FIG. 4 shows a graphical representation of an embodiment capable of indicating five battery charge values. Corresponding Table 2 shows these values.

TABLE 2

| Charge Status Data | Value | Output |
|---|---|---|
| 81–100% | 5 | 402 |
| 61–80% | 4 | 404 |
| 41–60% | 3 | 406 |
| 21–40% | 2 | 408 |
| 0–20% | 1 | 410 |

In this embodiment, if the processor receives data from the monitoring device that corresponds to a charge status of approximately 81–100 percent remaining, then the processor can map or assign the highest of five values from a group and cause the LED 166 to output the pattern represented by output 402. This output can include an indication period 402c comprising five active states 402a separated by four inactive states 402b. The output further shows the rest period 402d following the indication period. FIG. 4 shows the various rest periods (402d–410d) to be of a duration approximately five times that of any one inactive state comprising an indication period.

If the processor receives data from the monitoring device that corresponds to a charge remaining of approximately 61–80 percent then the processor can cause the LED to output the pattern represented by output 404. A charge remaining of approximately 41–60 percent can cause output 406 to be output. A charge remaining of approximately 21–40 percent can cause output 408 to be output, and approximately 0 to approximately 20 percent can cause output 410 to be generated.

First Exemplary Method

Figure 5:
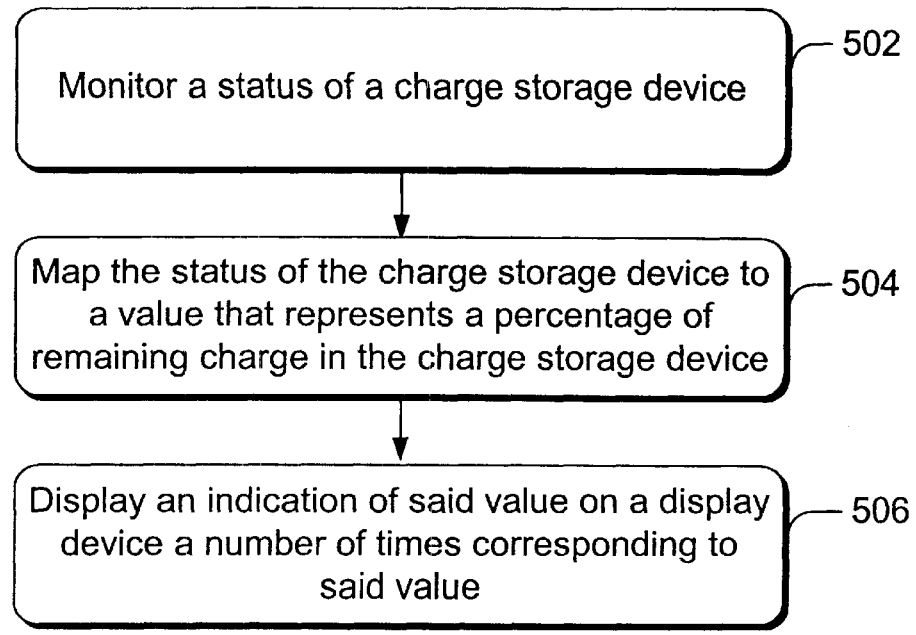
FIG. 5 is a flow diagram describing steps in a method in accordance with one embodiment.
Figure 6:
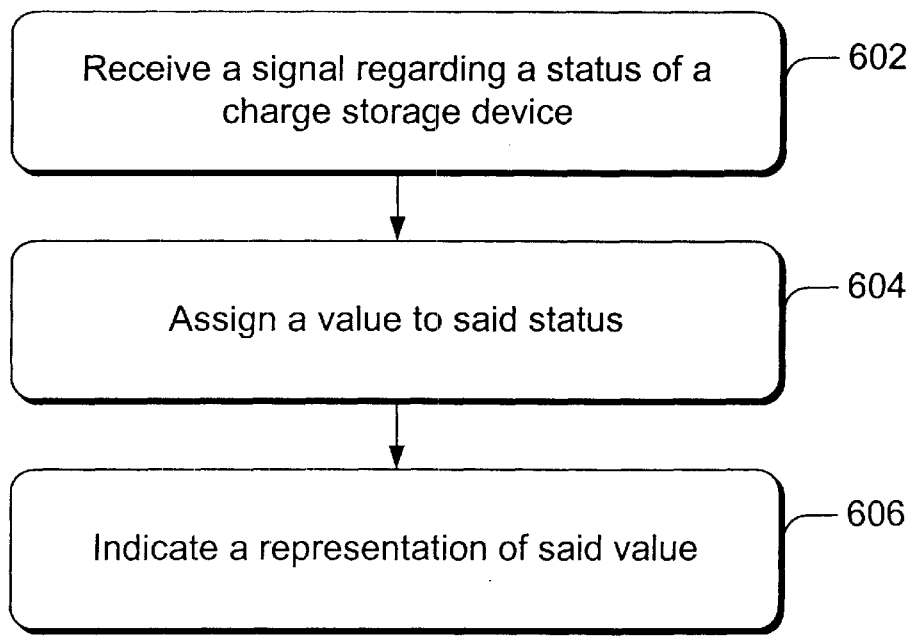
FIG. 6 is a flow diagram describing steps in a method in accordance with one embodiment.

FIG. 5 shows steps in a method in accordance with one embodiment. The method can be implemented in any suitable hardware, software, firmware, or combination thereof.

Step 502 monitors a status of a CSD. Monitoring can be accomplished with commercially available products that can be configured to monitor a charge status of a CSD. These include smart batteries. Such smart batteries can self-monitor a state or status of the charge storage component of the smart battery. Other statuses of a CSD can be monitored.

Step 504 maps the status of the CSD to a value that represents a percentage of remaining charge in the CSD. Such mapping is commonly achieved on a processing device or processor 102 that receives data regarding a status of a CSD. The processor can receive data from the monitoring device and map to a value that represents a percentage of remaining charge. For example, in an embodiment that has three display level values, the processor can receive monitored data from step 502 and map the data into a corresponding one of three display values. A processor for mapping from the monitored data to a display value can be one that is commonly found on various electronic devices. The corresponding display value can be displayed for a user.

Step 506 displays an indication of the value on a display device by activating and inactivating the display device a number of times corresponding to said value. FIGS. 3 and 4 illustrate ways of displaying the value by creating an output comprising two conditions or states, an ON condition, and an OFF condition. The pattern created by this displaying can create a human-perceptible display that can quickly and unambiguously convey a relative charge status value to a user. Some embodiments can comprise displaying an indication cycle that is comprised of an indication period and a rest period. The indication period comprises activating and inactivating the display device a number of times representing the value. This can be followed by the rest period that comprises an inactive period of a duration greater than any of those comprising an indication period. The indication cycle can be repeated as long as the value determined by the processor remains the same. When the value changes, the indication cycle can change accordingly.

Second Exemplary Method

Step 602 receives a signal regarding a status of a CSD. Any type of signal that can provide information regarding the status of a CSD can be received.

Step 604 assigns a value to the status received in Step 602. The value that is assigned can be from a group of at least two values. Larger groups can be used. Groups of three to five can provide valuable user information regarding the charge status of the CSD while being easy for the user to ascertain.

Figure 7:
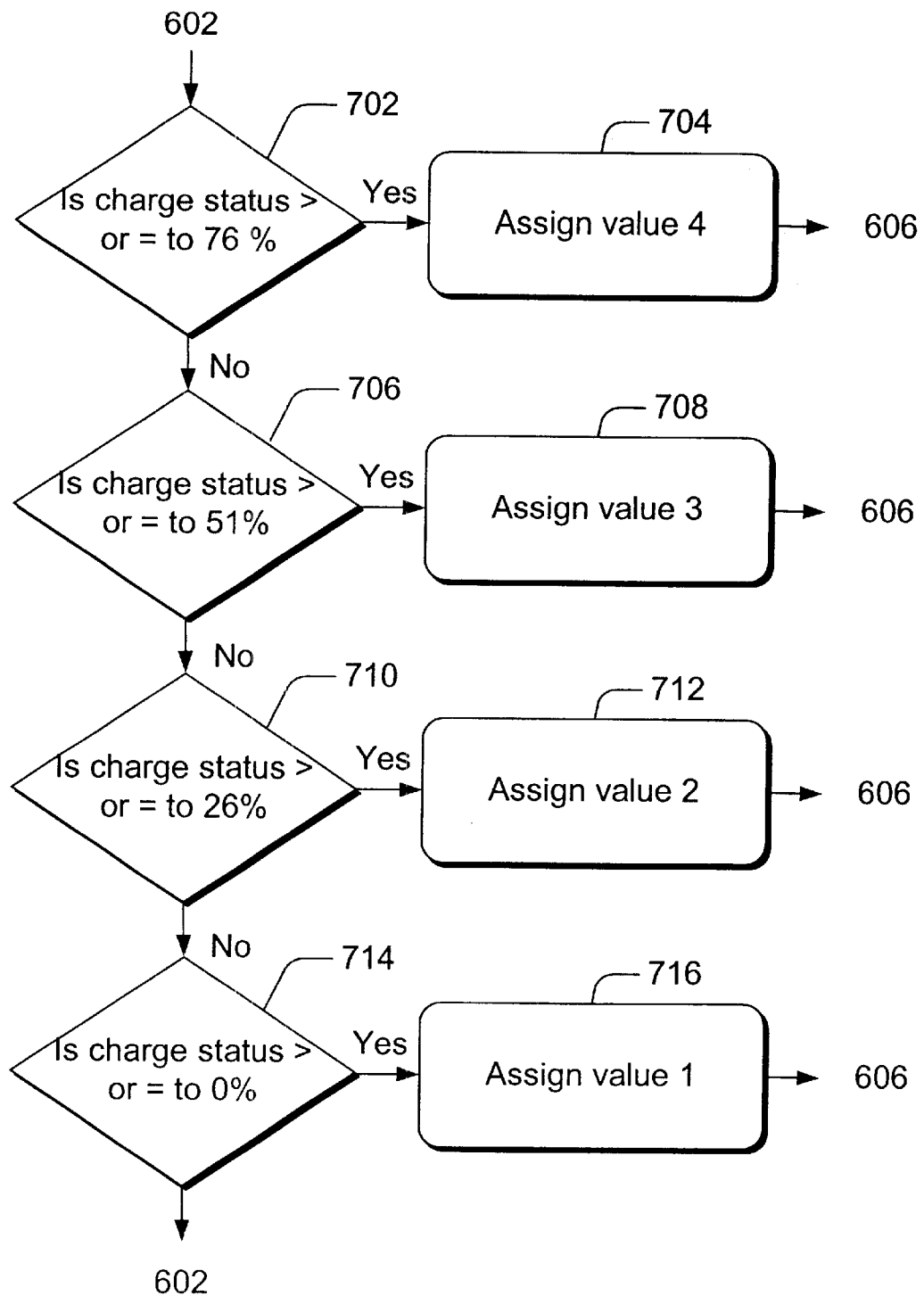
FIG. 7 is a flow diagram describing steps in a method in accordance with one embodiment.

FIG. 7 is a flow chart that can allow a processor to assign a value to the signal received in step 602. In this example, as in FIG. 3, there are four possible values. If the charge status is greater than or equal to 76 percent, then the processor assigns the value four to the charge status at 704. If not the processor continues to 706. If the charge status is greater than or equal to 51 percent, then the processor assigns value three at 708. If not, the processor proceeds to 710. If the charge status is greater than or equal to 26 percent the processor assigns the value of 2 to the charge status at 712. A charge status of zero or greater is assigned a value of 1 at 714. Once a value is assigned, the processor can proceed to step 606. Any charge status not assigned a value can allow the processor to return to 602.

Step 606 indicates a representation of said value. The representation can be indicated in various forms, several of which have been described above.

Conclusion

The described embodiments can provide useful information to a user of an electronic device by monitoring a charge status of a CSD configured to power the electronic device. A processor can convert the monitored charge status into a value associated with the charge status. The processor can then cause an indicator to be activated and inactivated a series of times. The series can represent the value associated with the charge storage device's charge status. Following the series, the indicator can be inactive for a duration of time hat distinguishes one series from the next series. This can allow a user to quickly ascertain a relative charge status of a charge storage device.

What is claimed is:

1. A charge storage indication device, comprising;
   a monitoring device for monitoring a charge status of a charge storage device;
   a processor coupled with said monitoring device for converting a monitored charge status into a value associated with a charge storage device status; and,
   a light-emitting device operably coupled to said processor and capable of indicating a user-perceptible representation of said value, said representation comprising an indication period comprising a series of alternating ON and OFF conditions where the number of ON conditions in a series represents said value and said indication period is followed by a rest period comprising an OFF condition of greater duration than any individual OFF condition comprising the preceding indication period.

2. The charge storage indication device of claim 1, wherein said value is selected from a group comprising two or more different values.

3. The charge storage indication device of claim 1, wherein said value is selected from a group comprising three to five different values.

4. The charge storage indication device of claim 1, wherein said value represents a percentage of the charge remaining in the charge storage device.

5. The charge storage indication device of claim 1, wherein said value represents an amount of operational time remaining in the charge storage device.

6. The charge storage indication device of claim 1, wherein said light-emitting device comprises a single LED.

7. The charge storage indication device of claim 1, wherein the ON state of said indication period also provides notification that an electronic device powered by the charge storage device is in a standby mode.

8. The charge storage indication device of claim 1, wherein the monitoring device comprises a smart battery.

9. A charge storage indication device, comprising;
   a monitoring device capable of monitoring a status of a charge storage device;
   a processor coupled to the monitoring device and configured to assign a value to said status;
   an indicator operably coupled to the processor and capable of indicating a representation of the value; and,
   wherein said representation comprises an indication period comprising alternating ON and OFF states of the indicator where the number of ON states represents said value, and wherein the indication period is followed by a rest period, and wherein said rest period comprises an OFF state of greater duration than any individual OFF state comprising the preceding indication period.

10. The charge storage indication device of claim 9, wherein the indication period is comprised of ON and OFF states of equal duration.

11. A charge storage indication device, comprising;
    a monitoring device capable of monitoring a status of a charge storage device;
    a processor coupled to the monitoring device and configured to assign a value to said status;

an indicator operably coupled to the processor and capable of indicating a representation of the value; and, wherein said indicator comprises a light-emitting device.

12. The charge storage indication device of claim 11, wherein the light-emitting device comprises a single LED.

13. A charge storage indication device, comprising;

a monitoring device capable of monitoring a status of a charge storage device;

a processor coupled to the monitoring device and configured to assign a value to said status;

an indicator operably coupled to the processor and capable of indicating a representation of the value; and, wherein said representation of said value occurs only when an electronic device powered by the charge storage device is in a standby mode.

14. A charge storage indication device, comprising;

a monitoring device capable of monitoring a status of a charge storage device;

a processor coupled to the monitoring device and configured to assign a value to said status;

an indicator operably coupled to the processor and capable of indicating a representation of the value; and, wherein the monitoring device comprises a smart battery.

15. A charge storage indication device, comprising;

a processor configured to receive data regarding a status of a charge storage device and assign a value to said status;

an indicator operably coupled to the processor and capable of indicating a representation of the value; and, wherein said representation comprises an indication period comprising alternating ON and OFF states of the indicator where the number of ON states represents said value, and wherein the indication period is followed by a rest period, and wherein said rest period comprises an OFF state of greater duration than any individual OFF state of the preceding indication period.

16. A method of indicating a charge level of a charge storage device, comprising:

monitoring a charge status of a charge storage device;

mapping the charge status of the charge storage device to a value that represents a percentage of remaining charge in the charge storage device; and, displaying on a display device an indication period corresponding to said value, said indication period comprising an alternating sequence of active and inactive periods of said display device wherein the number of active periods in the indication period represents said value.

17. The method of claim 16, wherein said indication period is followed by a rest period where the display device is inactive for a duration greater than any individual inactive period comprising the indication period.

18. A system for displaying the status of a charge storage device, comprising:

means for receiving data relating to a condition of a charge storage device;

means for assigning a value to said data;

means for causing a human-perceptible display to be generated where the display comprises an indication period and a rest period, wherein said indication period comprises alternating ON and OFF conditions of the display, and wherein the number of ON conditions represents said value and where the indication period is followed by a rest period comprising an OFF condition of longer duration than any individual OFF condition comprising the indication period.

\* \* \* \* \*